United States Patent
Baldy et al.

(10) Patent No.: US 8,029,641 B2
(45) Date of Patent: Oct. 4, 2011

(54) DEVICE AND METHOD FOR LIQUID TREATMENT OF WAFER-SHAPED ARTICLES

(75) Inventors: Andreas Baldy, Villach (AT); Markus Gacher, Klagenfurt (AT); Michael Brugger, Millstatt (AT)

(73) Assignee: Lam Research AG, Villach (AT)

( * ) Notice: Subject to any disclaimer, the term of this patent is extended or adjusted under 35 U.S.C. 154(b) by 844 days.

(21) Appl. No.: 11/915,352

(22) PCT Filed: May 18, 2006

(86) PCT No.: PCT/EP2006/062412
§ 371 (c)(1),
(2), (4) Date: Nov. 23, 2007

(87) PCT Pub. No.: WO2006/125744
PCT Pub. Date: Nov. 30, 2006

(65) Prior Publication Data
US 2008/0196835 A1    Aug. 21, 2008

(30) Foreign Application Priority Data

May 25, 2005    (AT) .................................. A 905/2005

(51) Int. Cl.
*H01L 21/306* (2006.01)
*B08B 3/04* (2006.01)
*B05C 13/00* (2006.01)

(52) U.S. Cl. .............................. 156/345.23; 156/345.55
(58) Field of Classification Search ............. 156/345.55, 156/345.23
See application file for complete search history.

(56) References Cited

U.S. PATENT DOCUMENTS

| | | | |
|---|---|---|---|
| RE37,347 E * | 9/2001 | Maekawa et al. | 34/58 |
| 6,435,200 B1 | 8/2002 | Langen | |
| 2002/0050244 A1* | 5/2002 | Engesser | 118/20 |
| 2002/0189652 A1 | 12/2002 | Peace et al. | |
| 2003/0101929 A1 | 6/2003 | Yoshihara et al. | |
| 2004/0255985 A1 | 12/2004 | Xia et al. | |

OTHER PUBLICATIONS

International Search Report of PCT/EP2006/062412 filed May 18, 2006, date of mailing Oct. 16, 2006.

* cited by examiner

*Primary Examiner* — Sylvia R. MacArthur
(74) *Attorney, Agent, or Firm* — Young & Thompson

(57) ABSTRACT

Method and device for wet treating a defined peripheral edge-region of a wafer-shaped article having a first surface plane W1, a second surface plane W2 and an edge surface. The device includes a support for holding the wafer-shaped article; liquid dispensing members for dispensing liquid onto the first surface plane W1 of the wafer-shaped article not facing the support and liquid guiding member connected to the support for guiding at least a part of the liquid around the edge surface of the wafer-shaped article towards the second surface plane W2 of the wafer-shaped article facing the support thereby wetting at least the edge surface, wherein the liquid guiding member has the form of a ring.

14 Claims, 3 Drawing Sheets

DEVICE AND METHOD FOR LIQUID TREATMENT OF WAFER-SHAPED ARTICLES

The invention relates to a device and a process for liquid treatment of a defined area of the main surface of a wafer-shaped article, especially a wafer.

The reason for treatment of a defined section of a wafer-shaped article, i.e. the section near the edge, especially of a wafer, will be described below.

A wafer, for example a silicon wafer, can have for example a coating of silicon dioxide, or carbon doped silicon dioxide (e.g. SiCOH, Black Diamond®) on all sides. For subsequent processes (when for example a gold layer or a layer of polysilicon (polycrystalline silicon) is to be applied), as well as in order to avoid flaking of such coatings, it can be necessary to remove the existing coating from the wafer at least in the edge area of the main surface, but also optionally in the area of its peripheral surface and/or the second main surface. This takes place by etching processes, which can be divided mainly into dry etching processes and wet etching processes. It can also be desirable to remove a metal (for example, copper), which has been electroplated, from certain areas of the main surface of the semiconductor substrate. In this case, this area can be either an annular section near the edge, or exactly the area of the front main surface (main surface on which the structures are located=device side), in which there are no structures, i.e. the chip-free zone.

Another application is the cleaning of wafers. Here it can be necessary to clean the wafer at least in the edge area of the main surface, but optionally also in the area of its peripheral surface and/or the second main surface, i.e. to remove particles and/or other contamination. This is done by wet cleaning processes.

Another liquid treatment is the application of layers, for example galvanic application of metals (electroplating). This can be done with or without current, in the latter case it is called "Electroless Electroplating".

The invention is directed to wet etching, wet cleaning or wet chemical application of layers (summarized under the term liquid treatment). The surface section of the wafer to be treated is wetted with the treatment liquid and therefore the layer or the impurities, which shall be removed, are removed. In another case a layer is built up in this surface section.

During liquid treatment the wafer-shaped article can be either stationary or can rotate (for example, around an axis perpendicular to the wafer-shaped article).

To prevent the treatment liquid from reaching the surface not to be treated in an uncontrolled manner, U.S. Pat. No. 4,903,717 suggests a carrier (chuck) which purges the surface, which faces the carrier and which is not to be treated, with a gas. In doing so the gas emerges between the edge of the wafer and the carrier.

For selectively treating a peripheral defined region of a wafer-shaped article U.S. Pat. No. 6,435,200B1 discloses a device for liquid treatment of a defined area of a wafer-shaped article, especially of a wafer, in which a mask is kept at a defined short distance to the wafer-shaped article, so that liquid can be retained between the mask and the defined area of the wafer-shaped article by capillary forces.

Such a device, however, requires that liquid, which is dispensed onto the wafer's surface not facing the mask, first has to wrap around the wafer's edge so that the liquid can enter into the gap between the mask and the wafer's surface facing the mask. This is specifically a problem if the liquid does not properly wet the wafer. This might happen if the wafer has a hydrophobic surface (e.g. bare silicon, organic polymer) and a the liquid, which is used to treat said surface, is a hydrophilic liquid (e.g. aqueous solution).

Another problem occurs if a very small edge area shall be treated (e.g. 0.3 mm from the edge). In such a case a mask as described in U.S. Pat. No. 6,435,200B1 may not be able to stop the liquid, which has been wrapped around the wafer's edge.

It is the object of the invention to provide a device and a method to overcome the abovementioned problems.

The invention meets the objects by providing a device for wet treating a defined peripheral edge-region of a wafer-shaped article having a first surface plane W1, a second surface plane W2 and an edge surface. The device comprises:
  a support for holding the wafer-shaped article;
  liquid dispensing means for dispensing liquid onto said first surface plane W1 of the wafer-shaped article not facing the support and
  liquid guiding member connected to the support for guiding at least a part of said liquid around the edge surface of the wafer-shaped article towards the second surface plane W2 of the wafer-shaped article facing the support thereby wetting at least the edge surface, wherein said liquid guiding member has the form of a ring.

With such a device it is now possible to force the liquid to wrap around the edge of the wafer-shaped article. This is possible even with liquid, which is not or badly wetting the article's surface.

Preferably said lip projects from the plane of symmetry M between the first surface plane and the second surface plane of the wafer-shaped article with respect to the support. This helps to collect liquid flowing over the first surface plane of the wafer-shaped article.

In a preferred embodiment of the invention said ring has a lip that projects from said first surface plane W1 with respect to the support. This lead to a better collecting capability of the liquid guiding member.

In an advantageous embodiment the ring has an outer diameter $d_1$ greater than the diameter $d_w$ of the wafer-shaped article, and an inner diameter $d_2$ smaller than the diameter $d_w$ of the wafer-shaped article, and an annular lip is formed in the surface of the ring. The annular lip is facing the same direction as the first surface of the wafer-shaped article. This brings the advantage to not only treat the article's edge and bevel region but also to treat the peripheral region of the articl's surface plane, which faces the support.

It is advantageous if the difference of $d_w$ and $d_2$ is not more than 3 mm ($d_w - d_2 \leq 3$ mm).

In another embodiment said ring has an inner surface facing the edge surface of wafer-shaped article when treated, wherein said inner surface forms a gap between said inner surface and the edge surface of wafer-shaped article with a gap distance g of not more than 2 mm ($g \leq 2$ mm).

The inner surface of the ring, which faces the edge surface of the wafer-shaped article, has the form of an inwardly open annular duct.

This inner surface facing the edge of the wafer-shaped article when treated preferably corresponds in form to the shape of the edge surface of wafer-shaped article so that a gap is formed between said inner surface and the edge surface, which leads to a gap distance g in a range over the gap of 0.8*g to 1.2*g.

Preferably the gap distance g is not more than 1 mm.

In yet another embodiment the ring has a first ring part facing the edge surface of the wafer-shaped article and a second ring part facing the second surface plane W2 of the wafer-shaped article. This gives the advantage that the edge and a peripheral region of the second surface plane of the wafer-shaped article can be wetted and treated.

In another embodiment the support is rotatable mounted for rotating the wafer-shaped article around an axis perpendicular to a surface plane. If then the support is rotated the radial outward movement of dispensed liquid is further enhanced.

Advantageously gas supply means are provided in the support in order to direct gas onto the second surface of the wafer-shaped article when treated. To guide the gas away from the edge of the wafer-shaped article, gas guiding means are provided, e.g. a gap between the liquid guiding member and the base body of the support.

Another aspect of the invention is a method for wet treatment of a defined peripheral edge-region of a wafer-shaped article having a first surface plane W1, a second surface plane W2 and an edge surface comprising holding the wafer-shaped article with a support
dispensing liquid onto said first surface plane W1
guiding said liquid around the edge surface of the wafer-shaped article towards the second surface plane W2 with liquid guiding member and thereby wetting said defined peripheral edge-region.

Preferably the liquid guiding member used in the method has the form of a ring, wherein said ring has a lip that projects from the plane of symmetry M between the first surface plane and the second surface plane of the wafer-shaped article with respect to the support.

In a preferred embodiment of the invented method the wafer is rotated by rotating the support.

Each thinkable combination of the above-mentioned embodiments of the device as well as of the method is considered to be covered by the scope of the invention.

Further details and advantages of the invented method will become apparent by the figures as well as the associated description below.

Figure 1:
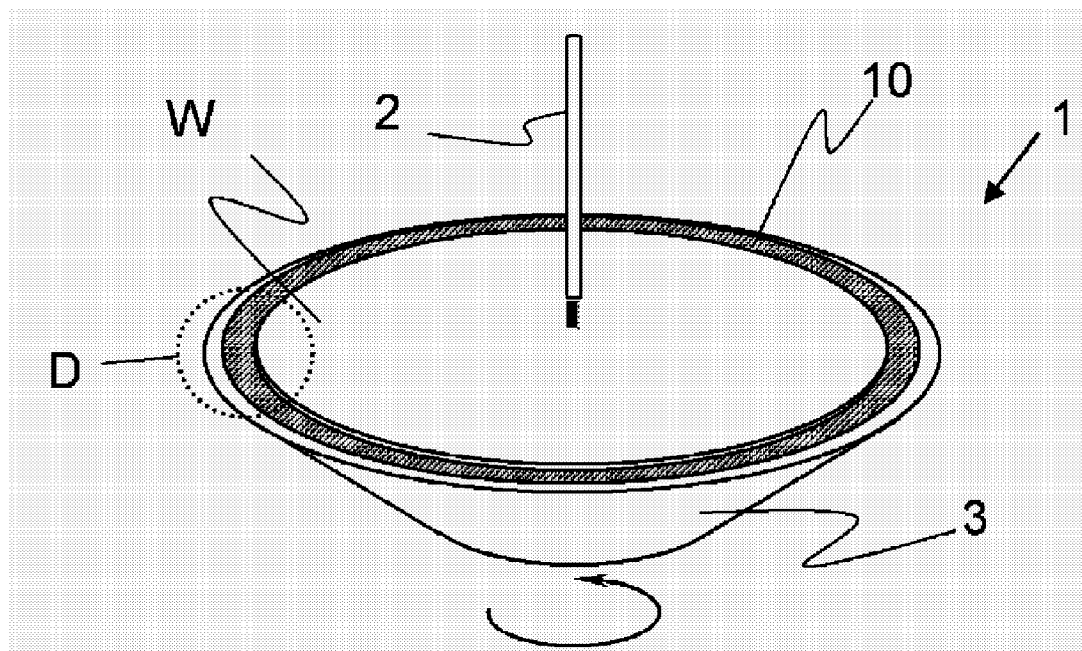
FIG. 1 shows a schematic view of an embodiment of the invention
Figure 2:
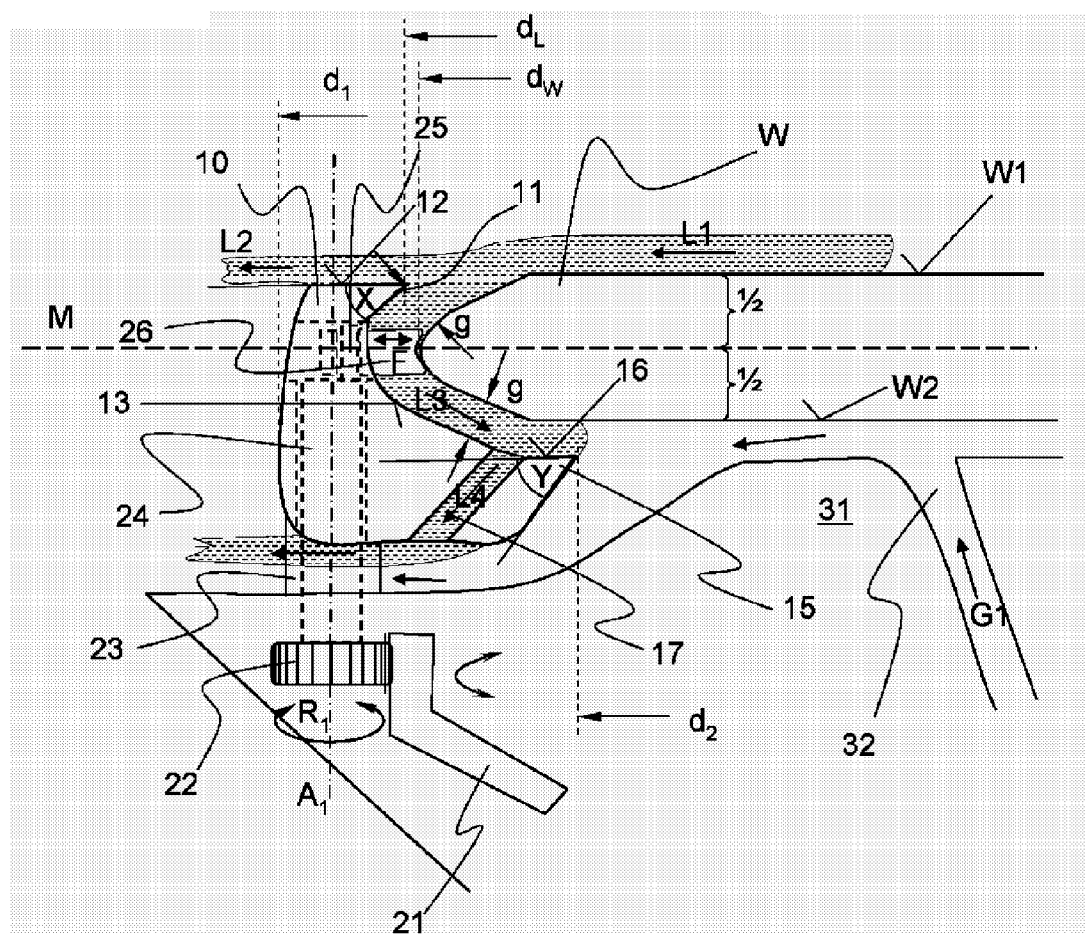
FIG. 2 shows a cross sectional view of the detail D of FIG. 1

Referring to FIG. 1 and FIG. 2 a preferred embodiment is described as follows.

FIG. 1 shows a device 1 for wet treating a defined peripheral edge-region of a wafer W. The device 1 comprises a support 3 for holding the wafer W, on which the wafer W can be securely held on its edge by gripping elements 26 (FIG. 2). The support 3 is mounted on a rotary shaft (not shown) and can be rotated by a drive mechanism (not shown) and thus the support 1 can be called spin chuck. Above the spin chuck a liquid dispenser 2 is arranged in order to dispense liquid onto the first and upper wafer surface, which is hereby defined as the wafer surface not facing the chuck.

On the chuck 3 a ring-shaped liquid guiding member 10 is mounted and held in a distance to the base body 31 of the chuck of about 2 mm with distance sleeves 23. In order to have the liquid guiding member rigidly mounted to the chuck 3 at least six distance sleeves are used over the circumference of the liquid guiding ring 10. The liquid guiding ring is mounted to the chuck by screws (not shown) or is welded or glued to the chuck.

In other words the lip 11 projects from the plane of symmetry M between the first surface plane W1 and the second surface plane W2 of the wafer-shaped article with respect to the support. The liquid guiding means 10 thus circumferentially surrounds the edge of the wafer W.

The inwardly facing surface 13 of the liquid guiding ring 10 corresponds to the shape of the edge including its bevels of the wafer to be treated. It is shaped so that a gap is formed between the wafer W and the liquid guiding ring 10 of a distance g. The distance g is about 1 mm. The inwardly facing surface 13 and the upper surface 12 include an acute angle X of about 40° and thus a knife shaped inwardly facing lip 11 is formed on the upper part of the liquid guiding ring 10. The diameter $d_L$ of the lip 11 (liquid guiding lip) is grater than the wafer's diameter $d_W$. This is merely because of the necessary clearance when placing the wafer on the chuck. If the liquid guiding ring 10 is divided into two or more segments (preferably three segments), which can be radially moved with respect to the chuck's rotational axis A, the diameter $d_L$ of the lip 11 can even be selected smaller than the wafer's diameter $d_W$. If such segments are used the wafer can be gripped by inwardly facing projections of the segments.

The inner diameter $d_2$ of the liquid guiding ring 10 is smaller than the diameter $d_W$ of the wafer W. The inner diameter $d_2$ defines the inner border of the lower wafer surface W2 (facing the chuck) which shall be treated.

The inwardly facing surface 13 at its lower part becomes the upwardly facing inner surface 16 which faces the second surface plane of the wafer W2.

In the upwardly facing inner surface 16 drainage openings 17 are formed in the liquid guiding ring in order to guide liquid, which has been guided into the gap between the inwardly facing surface 13 and the wafer's edge, away from the wafer's lower surface W2.

During operation the wafer is securely held by gripping members 26. Over the circumference of the chuck there are at least three such gripping members arranged. Preferably six gripping members are used. For picking and placing the gripping members are moved radially outward for opening —as indicated by arrow F. Each gripping member 26 is actuated by an actuator 25 (eccentric pin), which is eccentrically mounted on a vertically arranged shaft 24 with a gear wheel 22, which can be rotated ($R_1$). The gear wheel 22 is driven by a gear ring 21 which is mounted in the chuck 3 concentrically to the chuck 3. The gear ring is held in a normally closed position by springs. The shaft 24 is pivoted in the chuck base body 31 and projects through the distance sleeves 23 into the liquid guiding ring 10.

When the gear ring 22 is twisted against the chuck base body 31 it drives all shafts 24 simultaneously about an angle of 70° and the actuator 25 moves the gripping member away from the wafer's edge.

Inwardly the chuck base body 31 gas openings 32 are formed in order to apply gas G1 onto the lower surface W2 of the wafer. This protects the part of the lower wafer surface, which shall not be treated with liquid from receiving splashes, and holds a wafer in a defined distance to the chuck before the wafer gripped by the gripping members 26 when being placed onto the chuck.

The gas flow G1, which flows towards the edge of the wafer is guided away from the wafer's edge by gas guiding lip 15 and leaves the chuck through the gap build up between the liquid guiding ring 10 and the chuck.

Following the operation of such a device shall be described.

A semiconductor wafer W is placed on the spin-chuck 3, e.g. with a vacuum gripper. Simultaneously nitrogen G1 is introduced through openings 32 to generate a gas cushion, on which the wafer floats in a defined distance to the upwardly facing inner surface 16, e.g. 0.2 mm.

Gripping members 26 are then closed to securely hold the wafer and to allow rotating the wafer with the spin-chuck.

Liquid is applied onto the upper surface of the wafer (first surface W1) at a flow of 0.5 l/min. During the liquid supply the chuck is rotated at a speed of 60 rpm. Liquid flows radially outward supported by centrifugal force along the liquid stream L1. At the lip 11 the liquid stream L1 is divided into two liquid streams L2 and L3. Liquid stream L2 flows over the upper surface 12 of the liquid guiding ring 10 and liquid stream L3 is directed into the gap between the inner surface 13 of the liquid guiding ring 10 and the edge of the wafer W. Thereby the liquid wets and treats the wafer edge. At lower liquid flow the whole liquid, which has been dispensed onto the first wafer surface might be directed into the gap. The gap has a distance g between the inwardly facing surface 13 and the edge surface of the wafer of g=0.5 mm.

The liquid leaves the gap through drainage openings 17 by forming liquid stream L4. Due to capillary forces the liquid is drawn into the gap between the upwardly facing inner surface 16 and will therefore wet and treat the lower surface of the wafer (second surface W2). Excess liquid, which cannot be drained through openings 17 may flow over the gas guiding lip 15. The liquid leaves the chuck together with the gas through the gap build up between the liquid guiding ring 10 and the chuck.

The treatment liquid thereafter is displaced by a rising liquid and the rinsing liquid is removed by well known drying processes, e.g. spin drying, blowing off with drying gas (2-propanol vapor, nitrogen or a combination thereof) or a combination thereof.

Figure 3:
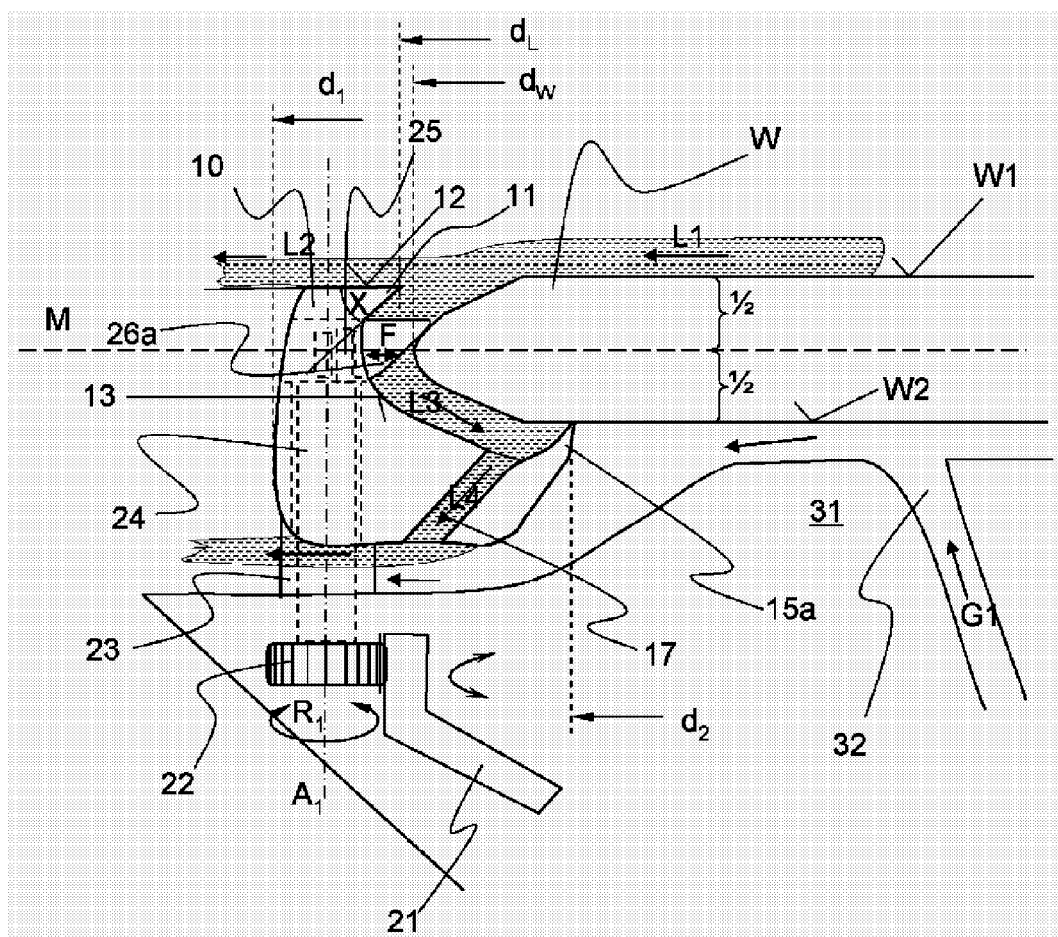

FIG. 3 shows another preferred embodiment based on the embodiment as shown in FIG. 2. Gripping members 26a have a slanted surface in order to apply downwardly directing force to the wafer. The wafer is thus pressed against the modified lip 15a and securely held between the lip 15a and the gripping members 26a. The lip 15a therefore serves as a seal. Liquid, which wraps around the edge, is stopped by the seal, which is built by lip 15a. In this case nitrogen purge can even be omitted.

The invention claimed is:

1. A device for wet treating a defined peripheral edge-region of a wafer-shaped article having a first surface plane (W1), a second surface plane (W2), and an edge surface; the device comprising:
    a support for holding the wafer-shaped article, the support comprising at least three gripping members for securely holding said edge surface of the wafer-shaped article during operation, wherein the gripping members can be radially moved outwardly for opening; and
    liquid dispensing means for dispensing liquid onto said first surface plane (W1) of the wafer-shaped article not facing the support; and
    a liquid guiding member mounted to the support, the liquid guiding member for guiding at least a part of said liquid around the edge surface of the wafer-shaped article towards the second surface plane (W2) of the wafer-shaped article facing the support thereby wetting at least the edge surface,
    wherein said liquid guiding member has the form of a ring, said ring having a liquid guiding lip that projects from a plane of symmetry (M) between the first surface plane (W1) and the second surface plane (W2) of the wafer-shaped article with respect to the support, and
    wherein a diameter (dL) of the liquid guiding lip is greater than a diameter of the wafer-shaped article (dW).

2. The device according to claim 1, wherein an inwardly facing surface of the guiding lip and an upper surface of the guiding lip include an acute angle.

3. The device according to claim 1, wherein said liquid guiding lip projects from said first surface plane (W1) with respect to the support.

4. The device according to claim 1, wherein,
    said ring has an outer diameter (d1) greater than the diameter (dw) of the wafer-shaped article,
    said ring has an inner diameter (d2) smaller than the diameter (dw) of the wafer-shaped article, and
    said ring comprises an annular lip formed in a surface facing the same direction as the first surface plane (W1) of the wafer-shaped article.

5. The device according to claim 3, wherein the difference of the diameter (dw) of the wafer-shaped article and said ring has an inner diameter (d2) is not more than 3 mm (dw−d2≦3 mm).

6. The device according to claim 1, wherein,
    said ring has an inner surface facing the edge surface of wafer-shaped article when treated, and
    said ring inner surface forms a gap between said ring inner surface and the edge surface of wafer-shaped article with a gap distance (g) of not more than 2 mm (g≦2 mm).

7. The device according to claim 6, wherein said gap distance g is not more than 1 mm.

8. The device according to claim 1, wherein the ring has a first ring part facing the edge surface of the wafer-shaped article and a second ring part facing the second surface plane (W2) of the wafer-shaped article.

9. The device according to claim 1, wherein said support is rotatable mounted for rotating the wafer-shaped article around an axis perpendicular to a surface plane.

10. The device according to claim 1, further comprising:
    a gas supply means provided in the support, the gas supply means configured to direct gas onto the second surface plane (W2) of the wafer-shaped article when treated.

11. A method for wet treatment of a defined peripheral edge-region of a wafer-shaped article having a first surface plane (W1), a second surface plane (W2), and an edge surface, said method comprising the steps of:
    holding the wafer-shaped article on the edge surface with a support by gripping members, wherein there are at least three such gripping members arranged and for picking and placing the wafer-shaped article, and the gripping members are moved radially outward for opening;
    dispensing liquid onto said first surface plane (W1); and
    guiding said liquid around the edge surface of the wafer-shaped article towards the second surface plane (W2) with liquid guiding member and thereby wetting said defined peripheral edge-region,
    wherein said liquid guiding member has the form of a ring, and said ring has a liquid guiding lip that projects from a plane of symmetry (M) between the first surface plane (W1) and the second surface plane (W2) of the wafer-shaped article with respect to the support, and
    wherein a diameter (dL) of the liquid guiding lip is greater than a diameter (dW) of the wafer-shaped article.

12. The method according to claim 11, wherein an inwardly facing surface of the guiding lip and an upper surface of the guiding lip include an acute angle.

13. The method according to claim 11, wherein the wafer is rotated by rotating the support.

14. A device for wet treating a defined peripheral edge-region of a wafer-shaped article having a first surface plane (W1), a second surface plane (W2), and an edge surface; the device comprising:
    a support arranged for holding the wafer-shaped article, the support comprising at least three gripping members for securely holding said edge surface of the wafer-shaped article during operation, wherein the gripping members are radially moved outwardly for opening, said support rotatable mounted for rotating the wafer-shaped article around an axis perpendicular to a surface plane; and liquid dispenser arranged for dispensing liquid onto said first surface plane (W1) of the wafer-shaped article, the first surface plane (W1) positioned not facing the support; and a liquid guiding member mounted to the support and arranged for guiding at least a part of said liquid around the edge surface of the wafer-shaped article towards the second surface plane (W2) of the wafer-shaped article, the second surface plane (W2) positioned facing the support, thereby wetting at least the edge surface, wherein said liquid guiding member comprises a ring, said ring having a liquid guiding lip that projects from a plane of symmetry (M) between the first surface plane (W1) and the second surface plane (W2) of the wafer-shaped article with respect to the support, and wherein an inside, upper surface diameter (dL) of the liquid guiding lip is greater than an outside most diameter of the wafer-shaped article (dW).

* * * * *